United States Patent
Hamasaki

(10) Patent No.: US 7,315,330 B2
(45) Date of Patent: *Jan. 1, 2008

(54) SOLID-STATE IMAGE PICKUP ELEMENT INCLUDING A THINNING METHOD TO DISCHARGE UNNECESSARY IMAGE DATA

(75) Inventor: Masaharu Hamasaki, Kanagawa (JP)

(73) Assignee: Sony Corporation, Tokyo (JP)

( * ) Notice: Subject to any disclaimer, the term of this patent is extended or adjusted under 35 U.S.C. 154(b) by 144 days.

This patent is subject to a terminal disclaimer.

(21) Appl. No.: 11/159,952

(22) Filed: Jun. 23, 2005

(65) Prior Publication Data

US 2005/0237409 A1    Oct. 27, 2005

Related U.S. Application Data

(63) Continuation of application No. 09/792,245, filed on Feb. 23, 2001, now Pat. No. 6,967,685.

(30) Foreign Application Priority Data

Feb. 23, 2000  (JP) .............................. 2000-045594

(51) Int. Cl.
　　*H04N 5/225*　(2006.01)
　　*H04N 3/14*　(2006.01)
　　*H04N 5/335*　(2006.01)
　　*H04N 5/222*　(2006.01)
　　*H03K 23/46*　(2006.01)
　　*H01L 27/00*　(2006.01)

(52) U.S. Cl. .............. 348/314; 348/220.1; 348/333.11; 377/62; 250/208.1

(58) Field of Classification Search ............ 348/220.1, 348/296, 311, 312, 314, 322, 324, 333.01, 348/333.05, 333.11; 257/257, 549; 377/62, 377/63; 250/208.1
See application file for complete search history.

(56) References Cited

U.S. PATENT DOCUMENTS 4,884,142 A * 11/1989 Suzuki ....................... 348/296

(Continued)

FOREIGN PATENT DOCUMENTS

JP            11354772 A   *  12/1999

(Continued)

*Primary Examiner*—John M. Villecco
(74) *Attorney, Agent, or Firm*—Robert J. Depke; Rockey, Depke & Lyons, LLC.

(57) ABSTRACT

In a case where a thinning operation is implemented at the point when signal charges are read out from each of pixels to thin out pixel information by lines (row), the thinning may be performed only in the vertical direction, but not in the horizontal direction. In an all-pixel-read-out type CCD image pickup element, a discharge controlling section is provided in each of VH transfer stage sections transferring signal charges from vertical CCDs to a horizontal CCD, and where a thinning mode is selected, among those signal charges transferred from a plurality of the vertical CCDs, those of a given set of columns are stopped and discharged at the respective discharge controlling sections, and those of the rest of columns are transferred to the horizontal CCD, and at the same time, those of a given set of lines (rows) are stopped and discharged for all columns, thereby performing the thinning operation over the pixel information in both the vertical and horizontal directions at the VH transfer stage.

8 Claims, 5 Drawing Sheets

U.S. PATENT DOCUMENTS

| | | | |
|---|---|---|---|
| 5,223,725 A * | 6/1993 | Miwada | 257/239 |
| 5,440,343 A * | 8/1995 | Parulski et al. | 348/322 |
| 5,614,740 A * | 3/1997 | Gardner et al. | 257/222 |
| 5,874,993 A * | 2/1999 | Ciccarelli et al. | 348/316 |
| 6,215,521 B1 * | 4/2001 | Surisawa et al. | 348/316 |
| 6,400,404 B2 * | 6/2002 | Hirota et al. | 348/314 |
| 6,423,959 B1 * | 7/2002 | Ikeda et al. | 348/322 |
| 6,693,671 B1 * | 2/2004 | Stevens et al. | 348/314 |
| 6,707,498 B1 * | 3/2004 | Toma et al. | 348/322 |
| 6,867,803 B1 * | 3/2005 | Funamoto | 348/294 |
| 7,053,948 B2 * | 5/2006 | Konishi | 348/311 |
| 2005/0280726 A1 * | 12/2005 | Parks et al. | 348/282 |

FOREIGN PATENT DOCUMENTS

| | | | |
|---|---|---|---|
| JP | 2000134540 A | * | 5/2000 |
| JP | 2003153086 A | * | 5/2003 |

* cited by examiner

LINE-SHIFT OF 1ST LINE

LINE-SHIFTS OF 2ND THROUGH 4TH LINES

LINE-SHIFTS OF 5TH LINE

HORIZONTAL TRANSFER

SOLID-STATE IMAGE PICKUP ELEMENT INCLUDING A THINNING METHOD TO DISCHARGE UNNECESSARY IMAGE DATA

The subject matter of application Ser. No. 09/792,245 is incorporated herein by reference. The present application is a continuation of U.S. application Ser. No. 09/792,245, filed Feb. 23, 2001, now U.S. Pat. No. 6,967,685 which claims priority to Japanese Patent Application No. JP2000-045594, filed Feb. 23, 2000. The present application claims priority to these previously filed applications.

BACKGROUND OF THE INVENTION

1. Field of the Invention

The present invention relates to a solid-state image pickup element and a driving method thereof, and a camera system, and more specifically to a solid-state image pickup element capable of capturing both still images and dynamic picture images and a driving method of the same as well as to a camera system using the same.

2. Description of the Related Art

A digital still camera (DSC) uses, as its image pickup device, a solid-state image pickup element, such as a charge coupled device (CCD), implementing so-called all-pixel-read-out mode, in which the signal charges of all pixels are simultaneously read out to a vertical transfer section, and are transferred and outputted individually without being mixed in the vertical transfer section. For those CCD image pickup devices intended for the use in DSCs, efforts have been made to increase the number of pixels in an attempt to improve the capability of capturing still images in better quality.

In a case of a digital still camera, means must be provided to allow monitoring an image being captured in order to adjust the focus or the angle of the camera during picture taking. Accordingly, a digital still camera is generally equipped with a monitor to display a captured image, such as a liquid crystal display. Also, it is designed to be capable of selectively implementing a monitoring mode besides the still image mode for capturing a still image. In order to be able to display an image captured by, especially, a high-pixel-count CCD image pickup element on the liquid crystal display while in this monitoring mode, it is necessary to increase the frame rate.

In a digital still camera using, as its image pickup device, a high-pixel-count CCD image pickup element implementing the all-pixel-read-out mode, a thinning technique has hitherto been used as one approach for increasing the frame rate in the monitoring mode. This thinning technique, as implemented in a CCD image pickup element, provides thinned pixel information by reading out only the signal charges of pixels in a subset of lines (rows) to the vertical transfer section, and leaving the rest of the lines unread. This thinning technique provides a reduction in the amount of data in the vertical direction, so that the frame rate can be increased.

When attention is directed to those pixels in the lines (rows) to be thinned out in such a CCD image pickup element capable of implementing the thinning operation, while these pixels are subject to the thinning during the monitoring mode, they are read out in no different manner as those pixels of other lines during the normal still image mode, so that the driving pattern of those rows to be thinned out is different in the monitoring mode and in the still image mode.

Accordingly, in a conventional CCD image pickup element capable of implementing the thinning operation, two driving systems (driving pulse, driving terminals, wirings, etc.) for the regular lines from which the signal charges are read out, and for those lines from which the signal charges are not read out (rows to be thinned out) are necessary, and in addition, the driving systems once configured cannot be modified later as they are hardwired, so that this approach can provide only a predetermined thinning rate. In other words, one cannot arbitrarily select the vertical compressibility.

In addition, the conventional thinning technique involves the thinning operation of pixel information performed on a row-by-row basis at the point where signal charges are read out from the respective pixels, so that it may provide pixel information thinned in the vertical direction, but not in the horizontal direction. This means that, in the horizontal direction, the signal charges of all the pixels would be read out. Accordingly, when the pixel count is increased as a result of the efforts to enhance the performance of high-pixel-count CCD image pickup elements, the horizontal transfer section would have to be driven at a higher rate, and resulting in an increased driving frequency, thus, increased power consumption.

Moreover, in a case where the thinning operation is implemented at the point when the signal charges are read out from the sensor section as explained above, smears and dark currents are generated also in those thinned out transfer stages of the vertical transfer section in the same manner as the other transfer stages in which signal charges are present even though they have no signal charges so that these smears and dark currents are eventually added to the signal charges in the horizontal transfer section, and the proportion of smear and dark current components relative to the signal component per pixel is increased, resulting in deterioration in the image quality.

SUMMARY OF THE INVENTION

An object of the present invention, which has been made in consideration with the above problems, is to provide a solid-state image pickup element capable of reducing the smear and dark current components and obtaining pixel information that is thinned in both the vertical and horizontal directions, and also to provide a driving method of the same as well as a camera system using the same.

In order to achieve the above object, a solid-state image pickup element according to the present invention comprises a plurality of sensor sections arranged in a matrix of rows and columns for performing photoelectric conversion; a first charge transfer section for transferring signal charges read out from the plurality of sensor sections in a direction in which the rows are arranged; and a second charge transfer section for transferring the signal charges transferred from the first charge transfer section in a direction in which the columns are arranged, wherein, at the transfer stages transferring signal charges from the first charge transfer section to the second charge transfer section, the transfer of signal charges from a given set of columns is selectively stopped, and these signal charges are discharged on a column-by-column basis, and the transfer of signal charges from the other columns is selectively stopped, and these signal charges are discharged on a row-by-row basis The solid-state image pickup element having the above configuration is used as the image pickup device for a camera system.

In a solid-state image pickup element having the above configuration, as well as in a camera system using such a device as its image pickup device, even though the thinning operation over pixel information is not implemented at the point when signal charges are read out from each of the sensor sections, thinning may be performed not only by rows (thinning in the vertical direction), but also by columns (thinning in the horizontal direction) by selectively discharging signal charges from a given set of columns on a column-by-column basis, and signal charges of the other columns on a row-by-row basis during the course of the signal charge transfer from the first charge transfer section to the second charge transfer section.

DESCRIPTION OF THE PREFERRED EMBODIMENTS

Figure 1:
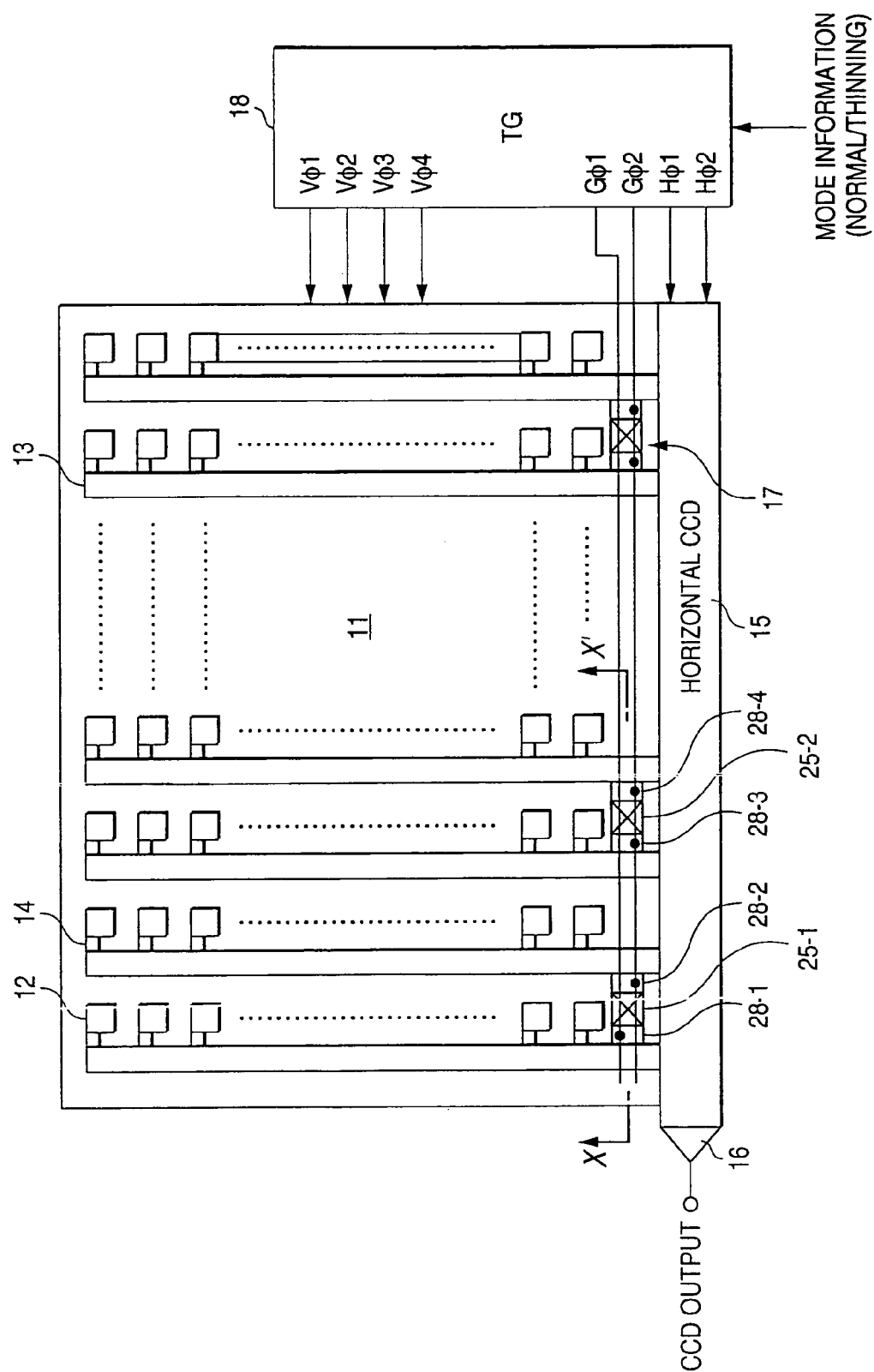
FIG. 1 is a schematic diagram of an all-pixel-read-out type CCD image pickup element according to a first embodiment of the present invention.

Embodiments of the present invention will now be explained in greater detail with reference to the attached figures. FIG. 1 is a schematic diagram of an all-pixel-read-out type CCD image pickup element according to a first embodiment of the present invention. The all-pixel-read-out type CCD image pickup element according to the present embodiment is explained herein as being capable of operating in the thinning mode for providing pixel information thinned in both the vertical (row arrangement) and horizontal (column arrangement) directions, as well as in the all-pixel-read-out mode.

In the configuration shown in FIG. 1, an imaging area 11 comprises a plurality of sensor sections (pixels) 12 arranged in a matrix of rows and columns over a semiconductor substrate (not shown), a plurality of vertical CCDs 13 each provided along the column direction of the pixels for every vertical column of the sensor sections 12, and readout gate sections 14 provided between the respective sensor sections 12 and the corresponding CCDs 13 for reading out signal charges from the sensor sections 12 to the vertical CCDs 13.

In this imaging area 11, each of the sensor sections 12 is constituted by a photo diode such as a PN junction, and is configured to convert incident light into a corresponding amount of signal charges. Each vertical CCD 13 is driven by, for example, four-phase vertical transfer pulses $V\phi1$ through $V\phi4$, and transfers signal charges read out from each sensor section 12 via the readout gate 14 in the vertical direction sequentially on a row-by-row basis without mixing them (hereinafter, this operation is referred to as a "line shift").

Provided at the bottom part of the imaging area 11, i.e., the destination side of the signal charges transferred by the vertical CCDs 13, is a horizontal CCD 15 for transferring the signal charges sequentially line-shifted by the vertical CCDS 13, in the horizontal direction. The horizontal CCD 15 is driven by, for example, two-phase horizontal pulses $H\phi1$ and $H\phi2$. Provided at the end of the transfer destination from the horizontal CCD-15 is a charge/voltage converter section 16 constituted by, for example, a floating diffusion amplifier.

Provided in a VH transfer stage section located between the plurality of vertical CCDs 13 and horizontal CCD 15, are discharge controlling sections 17 for selectively stopping the transfer of, and discharging the signal charges from a given set of columns on a row-by-row basis, and the signal charges from the remaining set of the rows on a column-by-column basis. These discharge controlling sections 17 perform the thinning operation over pixel information in both the vertical and horizontal directions through providing selective control pulses $G\phi1$ and $G\phi2$. The configuration of these sections will later be described in greater detail.

A timing generator (TG) 18 generates various timing pulses for driving the CCD image pickup element, including the four-phase vertical transfer pulses $V\phi1$ through $V\phi4$ for driving the vertical CCDs 13, two-phase horizontal transfer pulses $H\phi1$ and $H\phi2$ for driving the horizontal CCD 15, and the two gate control pulses $G\phi1$ and $G\phi2$ for driving the discharge controlling sections 17. This timing generator 18, together with a driver (not shown), etc., constitutes a driving system of the CCD image pickup element of the above configuration, and sends out the various timing pulses to various driving sections via the driver.

In the timing generator 18, especially the four-phase vertical transfer pulses $V\phi1$ through $V\phi4$, the two-phase horizontal transfer pulses $H\phi1$ and $H\phi2$, and the two gate control pulses $G\phi1$ and $G\phi2$ are generated at the timings adequate for the respective operating modes (normal mode/thinning mode) based on externally-supplied mode information.

Figure 2:
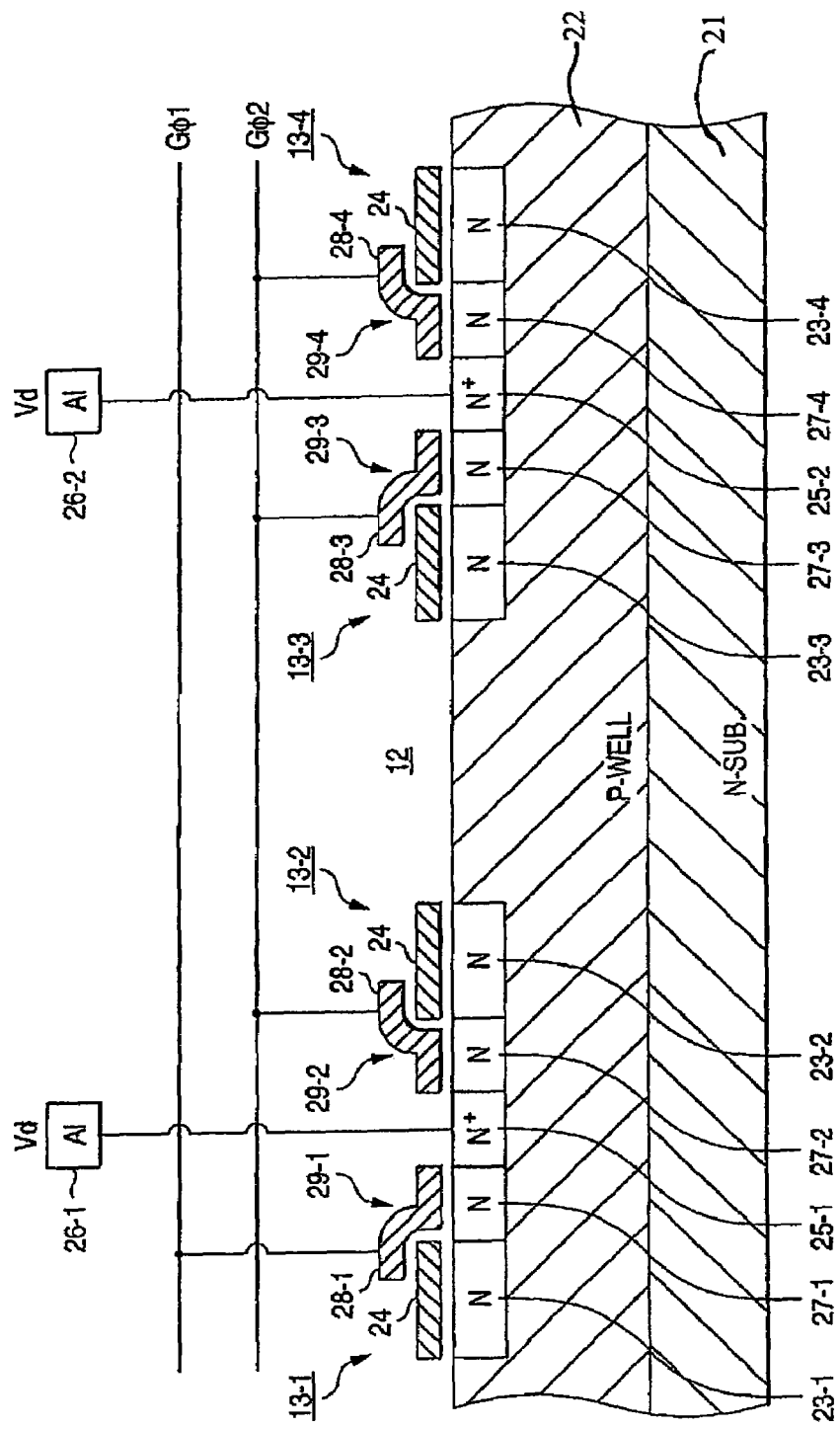
FIG. 2 is a schematic cross-sectional view of the device in FIG. 1 taken along the line X-X', illustrating an exemplary configuration of discharge controlling section of a CCD image pickup element according to the present invention.

FIG. 2 is a schematic cross-sectional view of the device in FIG. 1 taken along the line X-X', showing an exemplary configuration of the discharge controlling section 17.

With reference to FIG. 2, over, for example, an N-type semiconductor substrate 21, a transfer channel 23 (in the figure, indicated as 23-1 through 23-4) for transferring signal charges in the vertical direction (orthogonal direction relative to the surface of the paper) is formed by an N-type impurity via a P-well 22 on the top surface side of the P-well 22. This transfer channel 23, together with the transfer electrode (for example, a double-layer electrode structure) 24 provided thereon, forms a vertical CCD 13 (in the figure, indicated as 13-1 through 13-4).

In the region between two vertical CCDS, for example, in the center region between the leftmost vertical CCD 13-1 and the second vertical CCD 13-2 from the left, a drain section 25-1 is formed by an $N^+$-type impurity on the surface side of the substrate. This drain section 25-1 is in contact with an Al (aluminum) wire 26-1, and is biased by a given drain voltage Vd applied externally via this Al wire 26-1.

Between this drain section 25-1 and the two transfer channels 23-1 and 23-2 on its both sides, embedded channels 27-1 and 27-2 are formed. These embedded channels 27-1 and 27-2 are formed in the same profile as the transfer channels 23 (23-1 through 23-4) of the vertical CCDs 13, in other words, they are formed with the same N-type impurity, and these embedded channels and gate electrodes 28-1 and 98-2 thereon, formed independently from the transfer electrodes 24 of the vertical CCDs 13, constitute discharging gate sections 29-1 and 29-2 for selectively discharging signal charges from the transfer channels 23-1 and 23-2 into the drain section 25-1.

In these discharging gate sections 29-1 and 29-2, either of the aforementioned gate control pulses $G\phi1$ and $G\phi2$ is applied to the gate electrodes 28-1 and 28-2. Accordingly, the gate electrodes to which the different gate control pulses are applied are formed as electrodes of separate layers made of, for example, polysilicon or a metal (double-layer electrode structure).

In the case of the present embodiment, as shown in FIG. 2, the gate control pulse Gφ1 is applied to the leftmost gate electrode 29-1, and the gate control pulse Gφ2 is applied to the second, third and fourth gate electrodes 29-2, 29-3 and 29-4 from the left. For the rest of the gate electrodes from the fifth and later, the same pulse-application pattern of the first through fourth gate electrodes 29-1 through 29-4 is repeated for every four gate electrodes.

In the present embodiment, the discharge controlling section 17 is explained as providing one drain section 25-1, 25-2 . . . . . . for every two columns (two vertical CCDS), however, it may alternatively be configured to provide one drain section for every single column.

Next, the operations of the CCD image pickup element having the above configuration for the respective modes (normal mode/thinning mode) will now be explained. During the readout process of signal charges from the sensor sections (pixels) 12, the signal charges of all the pixels are simultaneously read out to the vertical CCDs 13 regardless of the operating mode.

In the normal mode, all signal charges read out to the vertical CCDs 13 must be sequentially line-shifted into the horizontal CCD 15, so that the timing generator 18 supplies the low-level control pulses Gφ1 and Gφ2 to the discharge controlling sections 17.

These low-level gate control pulses Gφ1 and Gφ2 are applied to each of the gate electrodes 28-1, 28-2 . . . . . . of the discharging gate section 29-1, 29-2, . . . . . . shown in FIG. 2. Upon this, each of the embedded channels 27-1, 27-2 . . . . . . of the discharging gate sections 29-1, 29-2, . . . . . . would turn into a shallow potential state, so that the signal charges in the vertical CCDs 13 would pass through the VH transfer stage section and reach to the horizontal CCD 15, and they would not flow into the drain sections 25-1, 25-2, . . . . . .

Therefore, while in the normal mode, all the signal charges read out to the vertical CCDs 13 are sequentially line-shifted on a row-by-row basis to the horizontal CCD 15 through the transfer behavior of the vertical CCDs 13, whereas the signal charges of every single row that have been line-shifted to the horizontal CCD 15 are horizontally transferred sequentially through the transfer behavior of the horizontal CCD 15, and are converted into signal voltages at the charge/voltage converter section 16, and then outputted.

Then, the operation of the thinning mode will now be explained with reference to the timing chart of FIG. 3 and the diagram of FIG. 4 illustrating the operation. The thinning operation performed in this embodiment is explained on the discharge controlling section 17, as being configured for thinning out three lines (rows) from every four lines (rows) in the vertical direction, and three columns from every four columns in the horizontal direction.

Figure 3:
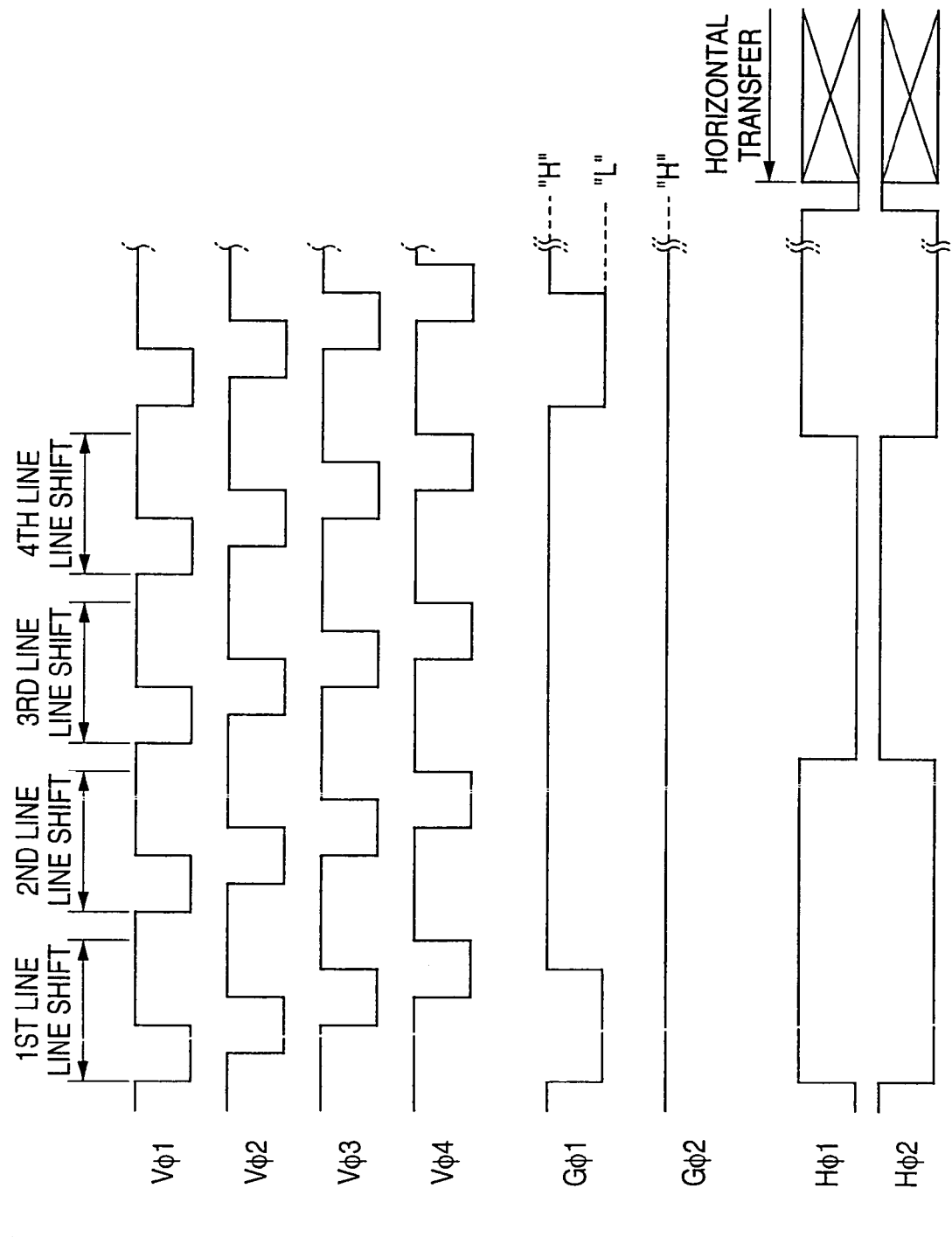
FIG. 3 is a timing chart of the thinning mode.

During the thinning operation in the present embodiment, the four-phase vertical transfer pulses Vφ1 through Vφ4, the two-phase horizontal transfer pulses Hφ1 and Hφ2, and the gate control pulses Gφ1 and Gφ2, having a relative timing relationship shown in FIG. 3, are outputted from the timing generator 18. In the illustrative diagram of FIG. 4, the symbols "o" represent signal charges to be eventually read out, and the symbols "•" represent signal charges to be thinned out.

At the point where the signal charges of all the pixels are simultaneously read out from the sensor sections 12 to the vertical CCDs 13, first, the signal charges of those pixels in the first line (row) would be line-shifted through the vertical transfer behavior of the vertical CCDs 13 driven by the four-phase vertical transfer pulses Vφ1 through Vφ4. At this point, the gate control pulse Gφ1 is in a low-level state, and the gate control pulse Gφ2 is in a high-level state.

Figure 4A:
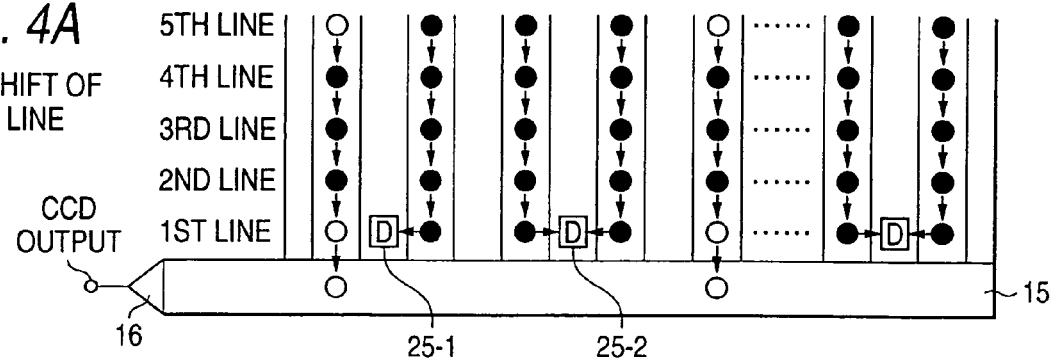
FIG. 4 is an illustrative diagram showing the operation during the thinning mode.

Accordingly, each of the embedded channels 27-1, 27-5 . . . . . . of the discharging gate sections 29-1, 29-5 . . . . . . on the side of the vertical CCDs 13 at the first, fifth . . . . . . columns would be turned into a shallow-potential state, so that the signal charges within those vertical CCDs 13 at the first, fifth . . . . . . columns would pass through the VH transfer stage section to reach to the horizontal CCD 15 as shown in FIG. 4A.

On the other hand, in the discharging gate sections 29-2, 29-3, 29-4 . . . . . . of the remaining vertical CCDs 13, each of the embedded channels 27-2, 27-3, 27-4, . . . . . . would turn into a deep-potential state, so that the signal charges in those remaining vertical CCDs 13 would be discharged to the respective drain sections (indicated as "D" in the figure) via the gate sections 29-2, 29-3, 29-4, . . . . . . .

As a result, among the signal charges of the first line (row), only those in the first, fifth, . . . . . . columns would be transferred to the horizontal CCD 15, and those in the rest of the columns are stopped at the discharge controlling sections 17 and discharged into the drain sections 25-1, 25-2 . . . . . . , so that thinned signal charges are obtained. The subsequent signal charges in the following three lines (rows) from the second through the fourth, are thinned out on a line-by-line basis at the respective discharge controlling sections 17.

More specifically, at the time of the line-shifting operation for the signal charges in these three lines (second through fourth lines), both the gate control pulses Gφ1 and Gφ2 are turned into a high-level state. Accordingly, as shown in FIG. 4B, the signal charges of the three lines from the second through fourth would be stopped at the discharge controlling sections 17 and discharged into the respective drain sections 25-1, 25-2 . . . . . . to be thinned out by every line-shifting behavior.

Figure 4B:
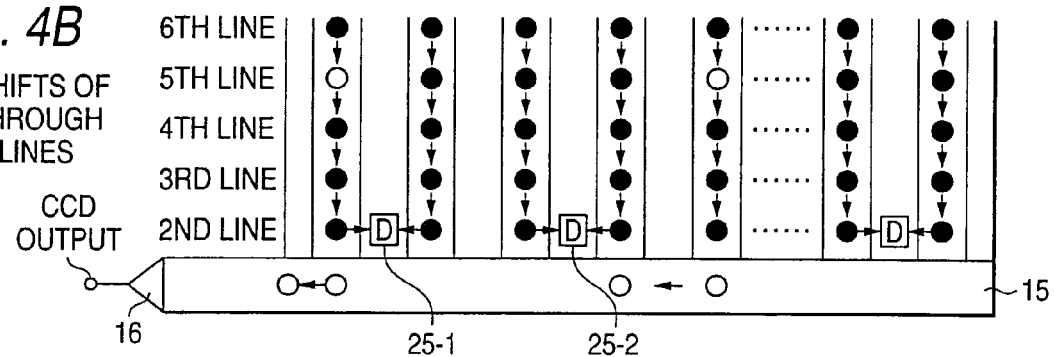
Figure 4C:
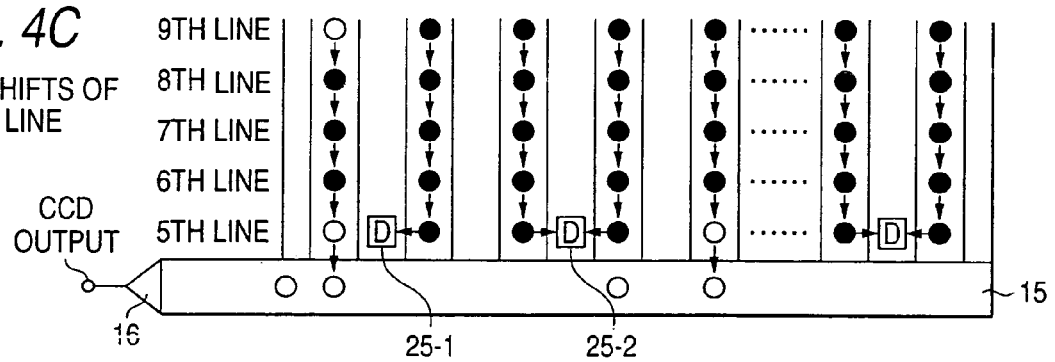

While the thinning operation is performed for the signal charges in these three lines, a 1-bit shift is performed in the horizontal CCD 15 to transfer the signal charges by 1 bit (by one transfer stage) as shown in FIG. 4B. The signal charges of the fifth line are line-shifted in a manner shown in FIG. 4C.

This line shift of the fifth line is performed in the same manner as the line shift of the first line. As a result, among the signal charges of the fifth line, only the signal charges in the first, fifth . . . . . . columns are transferred to the horizontal CCD 15, and the signal charges in the rest of the columns are stopped at the discharge controlling sections 17 and discharged into the drain sections 25-1, 25-2 . . . . . . to be thinned out.

The signal charges of the following three lines from the sixth through eighth lines are thinned out on a line-by-line basis in the same manner as the three lines from the second through fourth lines. Thereafter, the thinning by columns and by rows in the discharge controlling sections 17, and the 1-bit shift in the horizontal CCD 15 are repeated until all the packets (all transfer stages) of the horizontal CCD 15 are occupied with the signal charges.

Figure 4D:
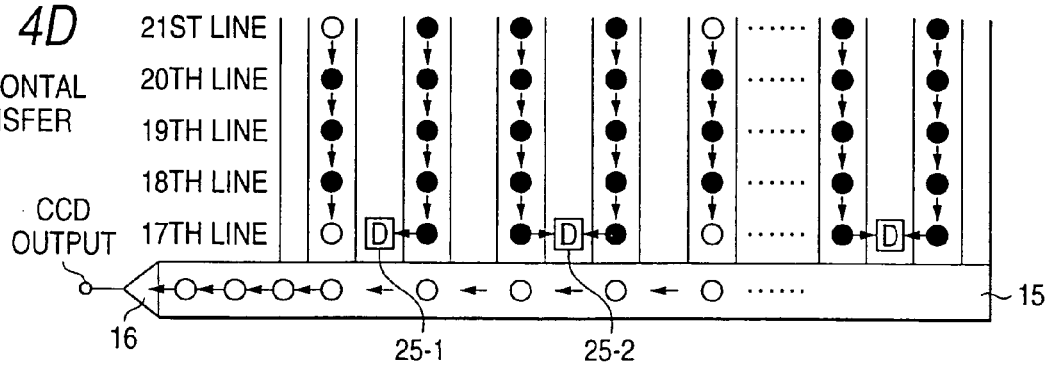

In the present embodiment, this operation is implemented for thinning out three lines of pixel data from every four lines in the vertical direction, and three columns of pixel data from every four columns in the horizontal direction, so that a series of the aforementioned steps are performed for every 16 lines. When the line-shifting steps are completed for the signal charges of 16 lines, and all the packets of the horizontal CCD 15 are occupied by the signal charges, the signal charges are sequentially transferred to the charge/voltage converter section 16 through the horizontal transfer behavior of the horizontal CCD 15 driven by the two-phase horizontal transfer pulses Hφ1 and Hφ2 as shown in FIG. 4D.

The charge/voltage converter section 16 converts the signal charges that are sequentially transferred on a pixel-by-pixel basis from the horizontal CCD 15 into signal voltages that are then outputted. At this point, the CCD output in the thinning mode would represent a signal in which a pixel signal derived from the 4 lines within the unit of 16 lines is repeated in a 4-pixel cycle. Accordingly, when the thinning mode is selected, a recovering process would have to be performed by a signal processing circuit located in the later stage for recovering a line-by-line signal that corresponds to the original pixel arrangement from that CCD output signal.

In the above description of the operation, the operation has been explained as being configured to thin out three lines (rows) of pixel data from every four lines in the vertical direction, and three columns of pixel data from every four columns in the horizontal direction. However, it should be understood that any other combination may also be used. That is, in the case of the vertical thinning operation, the thinning rate in the vertical direction may be arbitrarily determined by selecting the generation timing of the low-level gate control pulse Gφ1 shown in FIG. 3, which is the pulse to select lines to be transferred.

On the other hand, in FIGS. 1 and 2, the thinning rate in the horizontal direction may be controlled by selectively specifying the gate electrodes 28-1, 28-2 . . . . . . of the discharging gate sections 29-1, 29-2 . . . . . . to which the gate control pulse Gφ2 (the pulse to select the columns to be thinned out) is applied.

In this case, the thinning rate once designed would have to be hardwired since the gate control pulse Gφ2 is applied to the gate electrodes 28-1, 28-2 . . . . . . through patterned wirings. However, it is possible to allow the thinning rate in the horizontal direction to be arbitrarily set with a limited freedom by providing in advance several patterned wirings corresponding to several thinning rates, and using a configuration that allows the selection of either one of these patterned wirings to be used for applying the gate control pulse Gφ2.

Furthermore, in the above description of the operation, the horizontal transfer is explained as being conducted only after all the packets of the horizontal CCD 15 are filled with signal charges of a plurality of lines during the horizontal thinning, however, the horizontal transfer of the signal charges of the plurality of lines may also be conducted over several times. In this case, however, the horizontal transfer is preferably conducted after at least two lines (rows) of signal charges are line-shifted to the horizontal CCD 15 when the consideration is given to the reduction in the power-consumption of the CCD image pickup element as described later.

As explained above, in the all-pixel-read-out type CCD image pickup element, discharge controlling sections 17 are provided in the VH transfer stage section, and when the thinning mode is selected, among those signal charges transferred from the plurality of vertical CCDs 13, those from a given set of columns are stopped and discharged, and those from the rest of the columns are transferred to the horizontal CCD 15 and also, those of a given set of lines are stopped and discharged for all the columns, thereby obtaining pixel information thinned at the VH transfer stage section in both the vertical and horizontal directions.

Since pixel information may be thinned also in the horizontal direction at the VH transfer stage in this manner to reduce the amount of signal charges to be horizontally transferred by the horizontal CCD 15, the driving frequency of the horizontal CCD 15, that is, the frequency of the horizontal transfer pulses Hφ1 and Hφ2, may be reduced by that extent. For instance, considering a case where pixel information of three pixels is thinned out from each unit of four pixels in the horizontal direction, by conducting a horizontal transfer after signal charges of four lines are line-shifted to the horizontal CCD 15 (each involving a 1-bit shift), the driving frequency may be reduced to ¼ of a case in which every single line of the signal charges from all pixels are horizontally transferred. As a result, the power consumption of the CCD image pickup element may be reduced.

In the case of the vertical thinning, since the thinning operation is implemented in the VH transfer stage, not at the point where signal charges are read out from the sensor sections 12, those smear and dark current components, generated within the vertical CCDs 13 in association with the thinned-out pixels, may also be discharged along with the signal charges at the discharge controlling sections 17, so that it has an advantage in that the smear and dark current components may be reduced relative to a case in which the vertical thinning is conducted at the point where the signal charges are read out from the sensor sections 12.

It should be noted that, in the discharge controlling section 17, since the embedded channels 27-1, 27-2 . . . . . . of the discharging gate sections 29-1, 29-2 . . . . . . are formed in the same profile as the transfer channels 23-1, 23-2 . . . . . . of the vertical CCDs 13-1, 13-2 . . . . . . , there would be no difference in the potential level between them and the transfer channels 23-1, 23-2, . . . . . . when the transfer channels are in a deep potential state, so that smear and dark current components can be completely discharged from the transfer channels 23-1, 23-2, . . . . . . .

Figure 5:
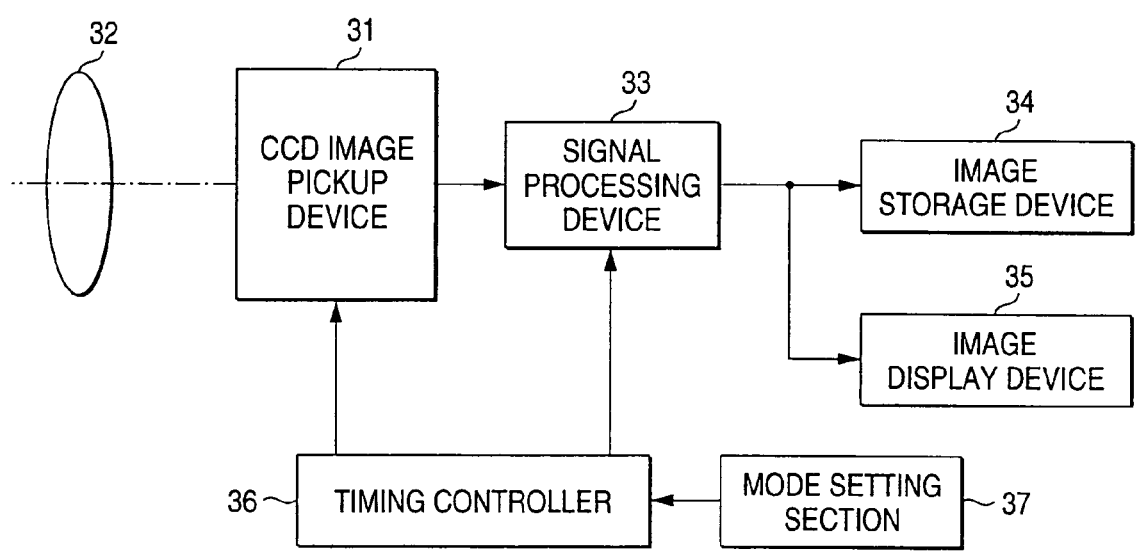
FIG. 5 is a block diagram showing an exemplary configuration of a camera system according to the present invention.

FIG. 5 is a block diagram showing an exemplary configuration of a camera system using a CCD image pickup element of the above configuration according to the present invention.

Referring to FIG. 5, the camera system according to the present invention comprises a CCD image pickup element 31 which serves as the image pickup device of the system, a lens 32 for collecting and forming an image of incident light (image light) from an object onto an image pickup surface of this CCD image processing CCD output signals from the CCD image pickup element 31, an image storage device 34 for storing the output signals from the signal processing circuit 33 in a storage medium, an image display device 35 for displaying the output signals of the signal processing circuit 33 on a monitoring display, a timing controller 36 for providing timing control for the whole system, and a mode setting section 37 for setting the image capturing mode of the CCD image pickup element 31.

Used herein as the CCD image pickup element of the camera system of the above configuration is a CCD image pickup element having the configuration priorly described, that is, the CCD image pickup element 31 capable of performing the thinning operation in both the vertical and horizontal directions in its VH transfer stage section. The mode setting section 37 accordingly sets the image capturing mode for this CCD image pickup element 31, either to a still image mode for capturing a still image or to a monitoring mode for monitoring an object to be captured (dynamic picture image mode). Herein, the "still image mode" corresponds to the "normal mode", and the "monitoring mode" corresponds to the "thinning mode" of the aforementioned CCD image pickup element, respectively.

In the aforementioned CCD image pickup element (see FIG. 1), the timing generator 18 generates various timing pulses such as the four-phase vertical transfer pulses V$\phi$1 through V$\phi$4, two-phase horizontal transfer pulses H$\phi$1 and H$\phi$2, and two gate control pulses G$\phi$1 and G$\phi$2, having the relative timing relationship shown in FIG. 3, when the monitoring mode (thinning mode) is selected through the mode setting section 37.

In this way, while in the thinning mode, the thinning operation is performed to thin out three lines (rows) of the pixel information from every four lines in the vertical direction, and three columns of the pixel information from every four columns in the horizontal direction in the VH transfer stage of the CCD image pickup element. Also in this monitoring mode (thinning mode), the thinning rate (compression rate) may also be controlled from a control panel (not shown) which also includes the mode setting section 37.

The image storage device 34 stores image signals processed by the signal processing circuit 33 into a storage medium such as a memory or a floppy disk when the still image mode is selected through the mode setting section 37. The pixel information stored in this storage medium can be reproduced as a hard copy using a printer, etc. The image display device 35 displays the image signals processed by the signal processing circuit 33 on a monitoring display such as a CRT (cathode-ray tube) or an LCD (liquid crystal display) as a dynamic picture image when the monitoring mode is selected through the mode setting section 37.

By the use of the CCD image pickup element according to the present invention as the image pickup device of a camera system such as a digital still camera, one would be able to monitor a dynamic picture image at a higher image quality with arbitrary compression rates in both the vertical and horizontal directions in the monitoring mode (dynamic picture image mode). Moreover, the ability to minimize the driving frequency in the horizontal direction in the monitoring mode (thinning mode) would reduce the power consumption of the CCD image pickup element, so that batteries would last longer.

As explained heretofore, according to the present invention, in a solid-state image pickup element and in a camera system using the same as its image pickup device, signal charges of a given sets of columns are selectively stopped and discharged on a column-by-column basis, and signal charges of the rest of columns are selectively stopped and discharged on a row-by-row basis at the transfer stage section transferring signal charges from the first charge transfer section to the second charge transfer section, so that even though the thinning operation is not implemented at the point where the signal charges are read out from each of the sensor sections, the thinning by rows. Furthermore, since any smear and dark current components may also be discharged at the aforementioned transfer stage sections, the quality of an image may be improved.

What is claimed is:

1. A solid-state image pickup element comprising:
   a plurality of sensor sections arranged in a matrix of rows and columns for performing photoelectric conversion;
   a first charge transfer section for transferring signal charges read out from said plurality of sensor sections in a direction in which the rows are arranged;
   a second charge transfer section for transferring the signal charges transferred from said first charge transfer section in a direction in which the columns are arranged; and
   a discharge controlling section provided in a transfer stage which transfers the signal charges from said first charge transfer section to the second charge transfer section, said discharge controlling section stopping the transfer of, and instead discharging, the signal charges of a given set of columns selectively on a column-by-column basis, and those signal charges of the remaining columns selectively on a row-by-row basis,
   wherein said discharge controlling section comprises a drain section, a transfer channel, and a discharging gate section provided between said transfer channel and said drain section for selectively discharging the signal charges from said transfer channel into said drain section, and
   wherein said discharging gate section comprises an embedded channel, formed in the same profile as said transfer channel, and a gate electrode disposed over said embedded channel.

2. The solid-state image pickup element according to claim 1, wherein said embedded channel is provided adjacent a column in a direction in which the columns are arranged.

3. The solid-state image pickup element according to claim 1, wherein said embedded channel is formed of the same impurity as the transfer channel and the drain section.

4. The solid-state image pickup element according to claim 1, wherein a depth of the embedded channel is formed substantially co-extensive with the depth of the transfer channel.

5. A camera system comprising:
   a solid-state image pickup element having a plurality of sensors arranged in a matrix of rows and columns, a first charge transfer section for transferring signal charges read out from said plurality of sensor sections vertically, a second charge transfer section for transferring the signal charges transferred from said first charge transfer section horizontally, and a discharge controlling section provided to transfer the signal charges from said first charge transfer section to the second charge transfer section, said discharge controlling section serving to discharge instead of transferring, those signal charges of a given set of columns selectively on a column-by-column basis, and those signal charges of any remaining columns selectively on a row-by-row basis;
   wherein said discharge controlling section comprises a drain, a transfer channel, and a discharging gate provided between said transfer channel and said drain for selectively discharging the signal charges from said transfer channel into said drain, and wherein said discharging gate comprises an embedded channel, formed in a same profile as said transfer channel, and a gate electrode disposed over said embedded channel; said system further comprising:

a mode setting means allowing an alternative selection between a first mode and a second mode; and driving means which does not drive said discharge controlling section to perform the discharging operation of signal charges when said first mode has been selected through said mode setting means, and which does drive said discharge controlling section to perform the discharging operation when the second mode has been selected through said mode setting means.

6. The camera system according to claim 5, wherein said embedded channel is provided adjacent a column in a direction in which the columns are arranged.

7. The camera system according to claim 5, wherein said embedded channel is formed of the same impurity as the transfer channel and the drain section.

8. The camera system according to claim 5, wherein a depth of the embedded channel is formed substantially co-extensive with the depth of the transfer channel.

* * * * *